(12) United States Patent
Kruit et al.

(10) Patent No.: US 7,842,936 B2
(45) Date of Patent: Nov. 30, 2010

(54) LITHOGRAPHY SYSTEM AND PROJECTION METHOD

(75) Inventors: Pieter Kruit, Delft (NL); Remco Jager, Utrecht (NL); Stijn Willem Karel Herman Steenbrink, Utrecht (NL); Marco Jan-Jaco Wieland, Delft (NL)

(73) Assignee: Mapper Lithography IP B.V., XK Delft (NL)

( * ) Notice: Subject to any disclaimer, the term of this patent is extended or adjusted under 35 U.S.C. 154(b) by 609 days.

(21) Appl. No.: 11/716,452

(22) Filed: Mar. 9, 2007

(65) Prior Publication Data
US 2008/0073588 A1 Mar. 27, 2008

Related U.S. Application Data

(60) Provisional application No. 60/781,040, filed on Mar. 10, 2006.

(51) Int. Cl.
*G21K 5/04* (2006.01)
(52) U.S. Cl. .............................. 250/492.22; 250/492.1; 250/492.2; 378/34
(58) Field of Classification Search ............ 250/492.22, 250/492.1, 492.21, 492.23, 492.3, 491.1, 250/492.2; 438/463, 487, 709, 712; 430/296, 430/297, 302, 415; 216/61, 62, 83, 87; 378/34; 355/57, 71; 356/51, 227, 230, 232
See application file for complete search history.

(56) References Cited

U.S. PATENT DOCUMENTS

| | | | | |
|---|---|---|---|---|
| 4,498,010 A | * | 2/1985 | Biechler et al. .......... | 250/492.2 |
| 5,103,101 A | * | 4/1992 | Berglund et al. ......... | 250/492.2 |
| 5,369,282 A | * | 11/1994 | Arai et al. .............. | 250/492.22 |
| 5,393,987 A | | 2/1995 | Abboud et al. | |
| 6,433,348 B1 | * | 8/2002 | Abboud et al. ......... | 250/492.22 |
| 6,565,386 B1 | | 5/2003 | Yoneyama et al. | |
| 2004/0135983 A1 | * | 7/2004 | Wieland et al. ............... | 355/67 |
| 2005/0104013 A1 | * | 5/2005 | Stengl et al. ........... | 250/492.21 |
| 2008/0054184 A1 | * | 3/2008 | Knippelmeyer et al. ..... | 250/396 ML |

FOREIGN PATENT DOCUMENTS

WO WO 2004/038509 A2 5/2004

* cited by examiner

*Primary Examiner*—Jack I Berman
*Assistant Examiner*—Nicole Ippolito Rausch
(74) *Attorney, Agent, or Firm*—Blakely, Sokoloff, Taylor & Zafman

(57) ABSTRACT

The present invention relates a probe forming lithography system for generating a pattern on to a target surface such as a wafer, using a black and white writing strategy, i.e. writing or not writing a grid cell, thereby dividing said pattern over a grid comprising grid cells, said pattern comprising features of a size larger than that of a grid cell, in each of which cells said probe is switched "on" or "off, wherein a probe on said target covers a significantly larger surface area than a grid cell, and wherein within a feature a position dependent distribution of black and white writings is effected within the range of the probe size as well as to a method upon which such system may be based.

15 Claims, 4 Drawing Sheets

LITHOGRAPHY SYSTEM AND PROJECTION METHOD

The present patent application is a non-provisional application claiming the priority of a provisional application of Application No. 60/781,040 filed Mar. 10, 2006.

TECHNICAL FIELD

The present invention relates to a probe forming lithography system for projecting an image pattern on to a target surface such as a wafer, using an "on" and "off" writing strategy, thereby dividing said pattern over a grid comprising grid cells, in each of which cells said probe is switched "on" or "off".

Such systems having a so called black and white writing strategy are widely known in the art, and may e.g. be laser based, and feature the use of direct writing means, so called maskless systems. By switching said probe on or of, each grid cell is either written or not respectively. Such probes are characterised by the probe effect in the target surface, which in turn is often described by a so-called point spread function. The point spread function (PSF) generally has a Gaussian distribution. Probe size from such a distribution is generally taken as the size of the distribution in which 50% of the energy of said probe is present.

One particular kind of such probe based lithographic system is known from the international patent publication WO2004038509 in the name of Applicant and involves a massive multiplicity of charged particle beams generated in a charged particle beams column, for writing said pattern on to said target, which writing beams are for that purpose scanned over said target, said target being capable of moving in a direction transverse to a scanning direction of said beams, and said writing beams being modulated for that purpose, based in which system pattern features are positioned on said target using a virtual grid over said target, and using writing information for modulating one or more charged beams.

Writing of a pattern by the known lithography system is thus effected by the combination of relative movement of the target surface and a timed "on" and "off" switching of a writing beam by said blanker optics upon signalling by said control unit, more in particular by a so-called pattern streamer thereof.

By the operational use of a virtual grid, the known systems are able to determine whether a writing beam is to be turned into "on" or "off" modus, which in the particular, exemplified system means whether the beam is to be blanked or not to blanked respectively. The size of such used grid is e.g. in the particular known embodiment determined by the question whether an accidental, i.e. unwanted fall out of a spot, the likelihood of which is considerable in nowadays multi writing beam systems, would be disturbing to the pattern to be written on to the substrate. Thus, a tendency exists to choose the grid as small as possible. This tendency is fed by the desire of designers to have a virtual infinite choice in designing a line- or object width or at determining a positioning location. The latter would, in accordance with an insight underlying the present invention, mean an additional possibility for correcting proximity effects at writing. On the other hand it is, particularly in massive multi writing beam systems, desired to have the grid as large as possible so as to limit the amount of data to be processed and transferred to the writing tool part of the litho system, and so as to enable the blanker to timely switch for correct writing of a feature, without the need for highly complex and/or relatively expensive blanker structures capable of swiftly switching.

As a balance between the above described conditions and as a reflection of the state of contemporary technology, the known litho machine discriminates so-called critical dimension cells, typically e.g. 45 nm, which are written by writing beams having a probe size of corresponding order, e.g. 30 nm, and which are divided into a multiplicity of grid cells, e.g. in 20 by 20 grid cells, thus of a small dimension relative to the probe size, e.g. of 2.25 nm. In such a setup an accidental blanking or not blanking of only one grid cell would only have a minor effect on a deposited dose of electrons, e.g. of only 0.25%, which effect is in practice to be considered negligible.

The present invention now deals with the problem of how to even more accurately position pattern features on a surface of a substrate to be patterned, in a raster based lithography system without the above said drawbacks thereof. Apart from the pre-mentioned reasons, particularly in multi beam writing beam systems, accurate positioning of features or edges thereof is extremely important, in particular since different parts of the substrate to be exposed may be patterned by different probes, such as different charged particle beams as in multiple beam systems, and since such would provide another instrument for correcting proximity effects, within the blanking tool, by sub-pixel re-location of features.

BACKGROUND

In other prior art, a widely used method to pattern a substrate with beams also is a raster scan. In order to accurately write the pattern on the substrate, the pattern is rasterized. Each charged particle beam performs its writing operation on a substrate to be patterned, which is positioned on a motor driven stage that is moved in a continuous way. At the same time the beam is scanned in a direction perpendicular to the stage motion. By supplying the writing information to the beam at right times, a pattern is written on a grid, which does not necessarily needs to be a Cartesian grid. A major problem in this art is that a feature can only be positioned within the dimension of a single grid cell. Issuing pattern design rules does not solve this problem, since before exposure, a pattern design needs to be corrected for several resolution-disturbing phenomena, like the proximity effect. These corrections can shift the edges of a feature away from a grid line.

A method towards improved accuracy of writing developed in the prior art of multi beam lithography systems is known from U.S. Pat. No. 5,103,101, in which a pattern is written by employing multiple passes. The pattern is first rasterized. After rasterization the pixels are separated in a selectable number of "phases". Each phase is printed in a separate raster scan. This results in the selected number of raster scans to construct the feature. Since the pitch between pixels is enlarged in two directions each scan can be performed at a higher speed. Thus, in this approach a pattern is partly written during a first exposure. The entire grid is shifted within the dimensions of a single grid cell and then a second part of the pattern is written. In this manner a feature edge can thus be positioned twice as accurate as before. By employing even more passes, a more accurate pattern placement can be obtained. A rather important disadvantage of this approach is the considerable loss of throughput implied by the multiple passes, especially at increased levels of accuracy.

Another known technique applying a raster, is known as grey writing, and for instance described in early U.S. Pat. No. 5,393,987. In this approach a relatively small number of grid cells is used. However, the applied dose within each grid cell is varied, e.g. to 0%, 30%, 70% and 100% by varying a duration of illumination. The 30% and 70% pixels are used along the edge of a feature, so as to locate the edge when written between the lines of a Cartesian raster. As a result, the position of a feature can be accurately tuned "without the need for multiple passes". Moreover, less data is needed to provide the same result. This known technique and system however, goes along with several disadvantages. E.g., the dose levels are created either by partial blanking or by controlling the exposure time. In such a set up, the required control of the discrete steps needs to operate in an extremely accurate way. Especially for high throughput applications such a requirement results in highly difficult designs for the lithography system, and correspondingly high costs thereof. Additionally the yield of such a system may suffer considerably. A single bit error in the pattern control data has a relatively large impact on the relevant exposure in the system, due to the relatively large grid dimensions. As a result a relatively high degree of processed substrates like masks or wafers, runs a risk of requiring to be repaired, or worse, of becoming destroyed, i.e. becoming irreparable.

Yet another method and machine designed towards overcoming the limitations of a raster or grid system is referred to by the term virtual addressing, and is for instance disclosed in U.S. Pat. No. 4,498,010. According to this system, in which the dimension of a grid cell is equalised to that of the probe size, an edge of a feature can be positioned halfway between two grid lines by writing additional pixels either before or after the selected feature, thus blanking the beam in alternating probe positions. This method, be it to the detriment of edge smoothness of a written feature, reduces the positioning error of the system, and favourably maintains throughput thereof. However, the system is limited to one particular distance of displacement of an edge, namely half the dimension of a grid cell, which in this system corresponds to half of a probe size, which in practice not only means that extension of positioning locations is limited to a single location halfway a pixel, but also, as the publication indicates, that such a shifted edge will be rather crude in shape. Not being related to a contemporary system with probe sizes significantly larger than pixel size, this known system neither teaches how to realise virtually infinite sub-pixel placement of smooth edges.

In a combination of a so-called vector scan writing strategy and a raster scan strategy as disclosed in US2002/0104970, the pattern to be written is rasterized and a group of pixels is combined, thereby forming a cell. Within this cell a finite number of possible pattern configurations is available. Each available configuration is given a shape code. The pattern is subsequently written by flashing each cell at a desired location, while moving from position to position in a raster scan way. The position of the edges can be tuned with respect to the grid of the rasterization by applying the right shape codes. Thus it could be stated that this particular patent publication discloses a form of grey writing using patterned cells. Apart from the fact that only a limited number of cell-configurations is used, it may be evident that such concept is not based on the contribution of single pixels as is dealt with in the lithography system under consideration.

The present invention aims at overcoming the restrictions imposed by a rastering method on positioning features on a substrate as in the prior art or, alternatively posed is directed to virtually independently from such raster or grid, positioning the edge of a feature at a desired location. More in particular such is aimed for at least virtually without loss in throughput of the lithography system, with maintenance of a relatively very fine grid structure, while employing a conventional black and white writing strategy, and virtually without reduction in edge smoothness of a feature. With such a probe forming lithography system in which in fact positioning of a feature is no longer, at least hardly limited to the finite size of a grid cell of to the half size thereof, a highly advanced critical dimension control is to be attained, more in particular even in a relatively economic manner, which critical dimension control renders a virtually unhampered placement possibility of edges on a target, virtually independent of an applied grid.

SUMMARY OF THE INVENTION

The present invention enhances the possibilities of contemporary lithography systems showing grid size significantly smaller than a probe size by virtually even further reducing pixel size through virtual infinite sub-pixel positioning of features and/or edges thereof, without loss of edge smoothness and, where applicable such as in maskless, massive multi beam systems, without the disadvantages associated with further reduction of grid size, i.e. without increase of data to be processed and transferred within the system, and without a need for technically complex and relatively expensive blanking systems as required for swift switching associated with small grid sizes.

The above effect is achieved by a system for projecting an image pattern on to a target surface such as a wafer, in which lithography system pattern features are positioned on said target using a virtual grid, in which system the point spread function of a writing beam probe on said target surface is significantly larger than the size of a grid cell in that it covers at least a multiplicity of grid cells, and in which system the edge of a feature to be written is positioned by the measure of modulating at least one set of at least a number of grid cells within said feature. With the present invention it is now possible to position features and/or edges thereof with an unprecedented level of precision and smoothness of such edges. It may be evident that the scope of the invention extends to various kinds of raster based lithography systems. It is further remarked that the invention is directed to writing features of a size larger than that of the grid cell.

With such a lithography system of contemporary nature and accordingly following specifications, highly accurate patterning of features is attained without the need for multiple passages, i.e. with maintenance of throughput, with relatively small grid measures, and without a requirement of changing a conventional black- and white writing tool. A particular advantage of the measures according to the invention is the new possibility to control features of a lithography system both in size and position thereof. A specific merit of the present invention is that it enables such refined positioning under the application of a point spread function that is significantly larger than the applied grid size. The latter is according to an insight further underlying the invention, desired, at least preferred for decreasing sensitivity to inaccuracy in line width and line width roughness.

Also, with the present invention, costs and technical complexity of a blanking part of the system need not be pushed to undue remote limits. For instance, at a typical contemporary lithography system, leaving out an entire line oriented in a mechanical or stage movement direction Mm rather than in a scanning direction Sd, would now require that the blanker can be switched on and off with a 1 pixel frequency and thus would require a rise/fall time that will in practice not be realized due to associated costs and structural complexity of a blanker complying to such requirement. Thus, departing from a limited, though economic operating frequency of a blanker, desired with a view to said reduction in costs and structural complexity, the pattern to be projected may favourably be adjusted according to a combination of two measures according to the invention, in such a way that an individual blanker of the system does not have to switch faster than such limiting frequency. These measures, which may also be applied separately, in short include addition of written pixels beyond a projected pattern edge and leaving out, i.e. not writing pixels near such border, within the projected boundary of the pattern.

In accordance with a further aspect of the present invention however, also a local dose modification may be performed within the range of several features up to large parts of the complete pattern so as to overcome an otherwise present proximity effect.

For patterns with a large difference in feature density within them it is possible that different parts of said pattern do not share a common development level, which means that parts of the exposed pattern will not show any features after development. By applying dose modulation between regions with different pattern density, i.e. less dose for dense parts of the pattern, a common development level is thus created by the invention. For the exact positioning of the feature edges this dose modulation is combined with writing or leaving out pixels at the edges or leaving out complete lines parallel to said edge.

In fact the invention also can be denoted as a lithography system of the described contemporary nature, which uses at least one of a set of measures for the purpose of shifting the position of a feature or an edge thereof, comprising:

writing additional pixels near an edge of a feature at the outside of a feature, in a manner having more than one consecutive on/off pixels between each on/off switch;

leaving out, i.e. not writing pixels or entire lines near the edge of said feature within the boundaries thereof;

lowering the energy dose within a pattern, for one or more entire features to be written by not writing part of the pixels encompassed by a feature, including the cells adjoining the projected edge there-of;

applying a combination of two or all of the three preceding measures;

The invention may also be typified in that it provides a solution, in particular a high quality solution, to a problem that could not have been solved solely by instructing designers that features may only be designed within a number of times a grid size. Because of proximity effects generally known in the art, features in the proximity of a structure to be written may shift the edge of a feature by arbitrary distances. Thus, a high need exists to economically and favourably locate edges of a feature at pre-viewed positions, i.e. at least virtually independent from an actually applied grid.

In the preceding respect, an insight underlying the present invention provides that the probe size of a beam, in particular an electron beam, is much larger than the grid size generally applied in contemporary lithography systems. Thus, when pixels are added immediately near the edge of a feature, e.g. as according to preference with an interruption of two or more blank grid cells between each pair of added cells, a raggedness of the edge thus created, will at least virtually not be noticeable in the final feature. Yet, the edge of the feature has been shifted in the final pattern towards the outside of the feature by a value of the number of written pixels divided by the modulus at which such number of pixels is added. For instance if line 1 is extended in width to n+1 pixels, line two also, and line three is maintained at a width n, defined by the applied grid, than the actual edge of the relevant feature will actually become located at grid location n+2/3. It is remarked that additional pixels may easily be located at a grid distance corresponding to around half of an applied probe size, without significant effect of raggedness of the finally attained feature shape. However, in this manner a significant subdivision pattern location within the dimension of grid cells, e.g. by a factor of 10 may be attained. In this respect, at a grid size of 2.25 nm, and with nine written lines left without an additionally written cell, a sub division of the edge definition of 0.22 nm is attained, while critical dimension control is contributed with 0.11 nm. It is further remarked that an alternative application and effect of the present measures, in accordance with the invention, is to increase the cell width of the applied raster, so as to reduce the required amount of electronic memory as is generally included in a pattern streamer subsystem. This effect of the present invention may e.g. in particular become interesting at so called massive multibeam lithography systems, e.g. with 10.000 writing beams or more.

A second, above mentioned solution according to the invention, and part thereof relates to leaving out, i.e. not to write grid points inside a feature, i.e. written structure. It is in accordance with yet further insight underlying the present invention acknowledged, that the point spread function of a probe is much larger than the address grid, and that positive use can be made of this condition. In particular the invention claims the idea and measure to leave out points inside the structure for the purpose of shifting the edge position of a feature, since the influence of a grid point near an edge, however within a feature spreads out to such edge. Such shift distance depends on how far away from a relevant feature edge grid points are deleted, i.e. not written. The effect of a deleted grid point is that at the edge it locally effectively lowers the dose and thus shifts the edge position of a feature.

The method of leaving out illumination, i.e. not writing on grid points inside a feature, alternatively denoted structure, is in accordance with a further aspect of the invention also used as an extra correction for proximity effects by dose correction. It is relatively easy to calculate because it effectively leaves exposure dose away, where neighbouring structures have already deposited dose. Effectively it is the use of grey levels. At e.g. a 20 by 20 grid, a half critical dimension square has 100 grid points, so effectively 100 gray levels plus the freedom to choose which grid points will be left unwritten.

According to a further aspect of the present invention, edge positioning can be favourably effected by combining the two in the preceding explained manners of positioning an edge, i.e. by adding pixels or by leaving pixels away, each in a specified manner.

In the sub-pixel placement of the features and/or edges thereof, the maximum number of possible steps is according to further insight underlying the invention limited, not only due to the limited range of the probe size, but also to a blanker constraint, i.e. with a view to maintain economically achievable blanking systems of technically limited complexity. This constraint is only set in the fastest scan direction in the case of a rasterscan such as the deflection scan in maskless, massively multi beam systems. This means that for feature edges lying in a direction of mechanical movement of a stage comprising said target to be written on, various types of "ragged edge" can be written, however, not writing of only a single line or part thereof in the same direction inside the border of the relevant feature will in practice not be feasible due to said blanker constraint. Therefore slightly different strategies for sub-pixel location of an edge apply in positioning edges lying in the direction of mechanical movement than for edges predominantly oriented in an electronic scanning direction.

From practical use of a lithography apparatus, it has in the field become apparent that the requirements set on a design grid for chips is not wanted. A contribution to the critical dimension control (CDC) and overlay is thus budgeted for this effect. With the mentioned ragged-edge method this is easily possible within less than a tenth of the grid size.

It is remarked that in accordance with the scope and aim of the invention, not only edges of a feature are positioned at sub-pixel level of accuracy, but also entire features can be located, dislocated or adapted in size accurately. In practice this means that more flexibility is achieved at favorably patterning, which image amongst others includes that a new manner of preventing line width errors due to proximity effects between features to be located on a target.

The invention further encompasses an idea and measure of limiting the overall energy dose for an image to be projected, such that the above-described purpose of placing features and edges thereof is effected. This is according to the invention realized by not writing part of the cells falling within the boundaries of the feature to be written, including arrays of cells directly adjacent an edge of a feature. Preferably but not necessarily such not writing of cells is performed in a predominantly regular pattern within the boundaries of a feature. In this manner features and the edges thereof may not only be located or displaced, but also the dimension, e.g. width of a feature may according to the invention be manipulated.

All of the three measures described in the above are according to the invention applied in combination, however may also be applied individually. One often-applied combination is the measure of adding written cells adjacent an edge, and outside a feature, and the measure not writing cells adjacent an edge inside a feature. In the computer programs used for positioning or manipulating features as described above, the entire range of possible combinations of the three measures is made available.

DRAWINGS

The invention will be further elucidated by way of example in the following embodiments of a mask-less lithography system according to the current invention, in which:

FIG. 1 is a schematic representation of a the prior art lithography system from which the present invention departs;

FIGS. 2A and B illustrate the alignment problem of known lithographic systems with a Cartesian grid;

In the figures, corresponding structural features, i.e. at least functionally, are referred to by identical reference numbers.

Figure 1:
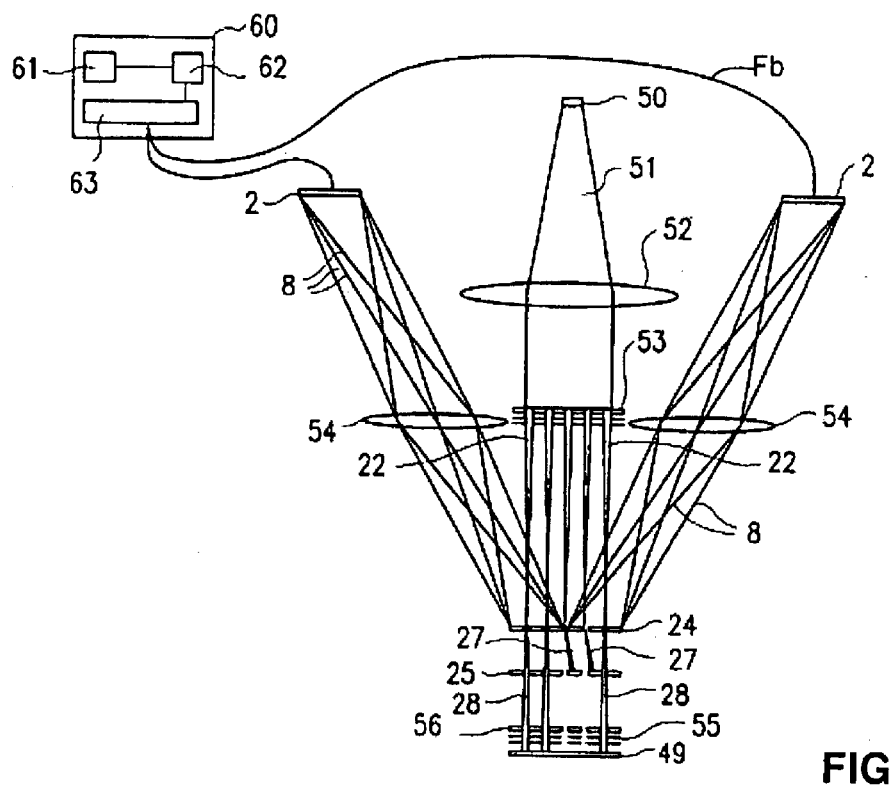

FIG. 1 represents an overall side view of one prior art lithography system that can be improved by the current invention. In this system, here described as an example where the present invention may be applied, at light emitter, or modulation means ends 2 of a light carrier Fb, in case embodied by optical fibers Fb, light beams 8 are projected on modulator array 24 using an optical system, represented by lenses 54. Modulated light beams 8 from each optical fiber end are projected on a light sensitive element, i.e. light sensitive part of a modulator of said modulator array 24. In particular, ends of the fibers Fb are projected on the modulator array. Each light beam 8 holds a part of the pattern data for controlling one or more modulators, the modulation thereof forming a signaling system for transferring pattern data based modulator array instructions for realizing a desired image on said target surface. FIG. 1 also shows a beam generator 50, which generates a diverging charged particle beam 51, in this example an electron beam. Using an optical system 52, in case an electron optical system, this beam 51 is shaped into a parallel beam. The parallel beam 51 impinges on aperture plate 53, resulting in a plurality of substantially parallel writing beams 22, directed to modulation array 24, alternatively denoted blanker array. Using modulators in the modulation array 24, comprising electrostatic deflector elements, writing beams 27 are deflected away from the optical axis of the litho system, and writing beams 28 pass the modulators undeflected. Using a beam stop array 25, the deflected writing beams 27 are stopped. The writing beams 28 passing stop array 25 are deflected at deflector array 56 in a first writing direction, and the cross section of each beamlet is reduced using projection lenses 55. During writing, the target surface 49 moves with respect to the rest of the system in a second writing direction.

The lithography system furthermore comprises a control unit 60 comprising data storage 61, a read out unit 62 and data converter 63, including a so-called pattern streamer. The control unit 60 is located remote from the rest of the system, for instance outside the inner part of a clean room. Using optical fibers Fb, modulated light beams 8 holding pattern data are transmitted to a projector 54 which projects the ends of the fibers on to the modulation array 24.

Figure 2A:
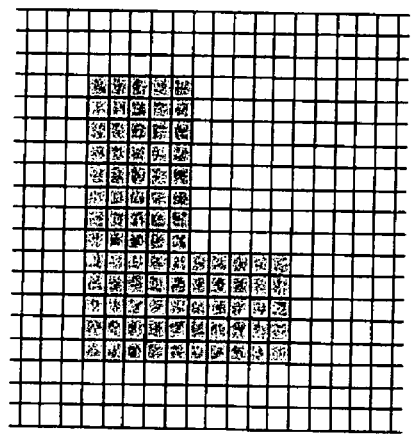
Figure 2B:
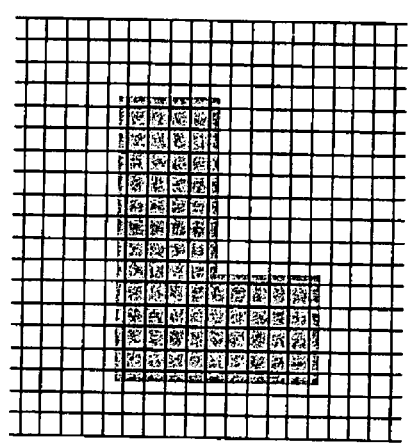

The subject of the present invention by which e.g. an above kind of lithography system is improved will first be illustrated in general lines, after which the invention will be discussed more in detail. FIGS. 2A and 2B illustrate a feature designed according to grid constraints and a feature designed unhampered hereby, as is desired by users of the system, and as is now made possible the invention. FIG. 2A shows a pattern perfectly aligned with an applied grid. Each grid cell is either fully exposed or not exposed at all. FIG. 2A shows the same pattern, which is now misaligned with the applied grid. The edges of the pattern do not fall on the grid lines corresponding to the writing grid of the exposure apparatus, however still show a virtually identical smoothness. This is the effect that is desired to be attained by the present invention, however which can not be attained by a conventional black and white writing strategy, which is limited to realising feature edges that co-inside with grid lines.

Figure 3:
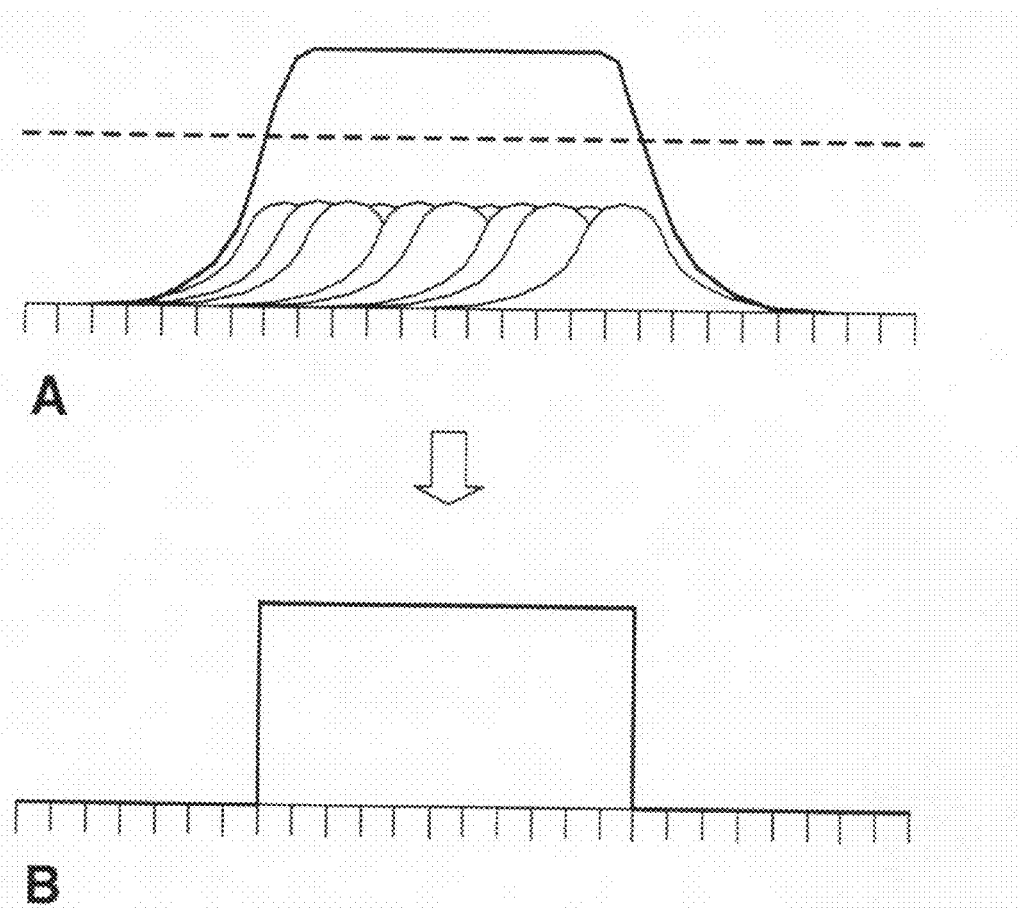
FIG. 3 illustrates the concept of pattern deposition using a Gaussian beam.

By FIG. 3 it is a.o. illustrated that a grid cell is exposed on a target when the center of the writing beamlet is positioned on top of the center of the cell. The diameter of the probe generated at incidence on a desired lithography target is much larger than the cell dimensions. For sake of clarity, the width of a gaussian probe as depicted in FIG. 3A is rather small compared to reality. In reality the probe is generally at least smeared out over a length of about ten grid cells. A full exposure of a certain cell thus also causes a partial exposure, an exposure with less intensity, in the cells adjacent to the exposed cell. So when a number of adjacent grid cells are fully exposed, the number of electrons deposited within an individual grid cell, the dose, constitutes of the sum of the dose received directly from exposure of the cell itself and indirectly via the exposure of adjacent cells. As a result the total dose exceeds the dose per grid cell when it is solely exposed, thus forming a broader and larger structure, as can be taken from the overall, top hat like graph line in FIG. 3A.

By choosing the right cut-off dose level however, in FIG. 3A denoted by the dashed line, the desired feature dimensions can be reconstructed. The result of such a reconstruction is shown in FIG. 3B.

Figures 4A, 4B:
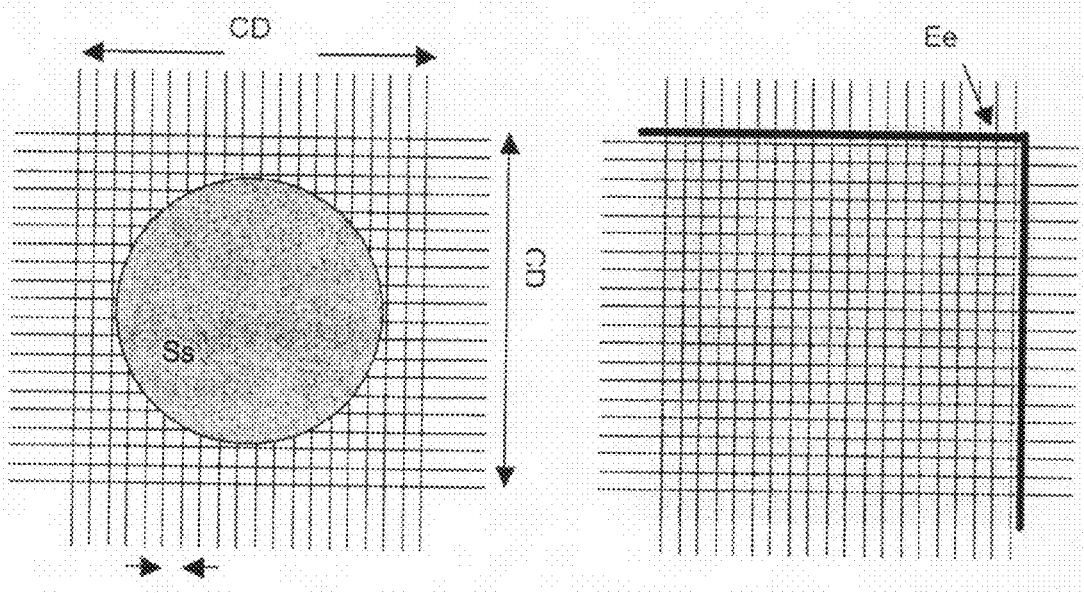
FIG. 4 illustrates the Gaussian beam principle from a top view, together with a third example of an edge locating pattern.

FIG. 4 shows a first effect of an embodiment of the present invention. In FIG. 4B the desired pattern to be drawn is shown in bold (lines Ee). The top edge of the feature does not align with the grid lines of the rasterized pattern. The bold line Ee drawn through the modulated top array of cells shows the rasterized pattern and edge thereof that is effectively written by the beamlets according to a measure of the present invention. The desired edges that did not align with the grid lines at writing, have a ragged shape. In FIG. 4A, the probe Ss effected by a writing beam is represented within a square raster portion of a size concurring to the typical width for a critical dimension CD of 45 nm. Since the probe size Ss of the writing beamlet is much larger than the size of a single grid cell Ps, alternatively denoted pixel size, the shape of the edge is invisible after developing the exposed pattern. The hatched, i.e. ragged edge in the rasterized pattern effectively shifts the eventual feature edge outwards to its desired position. The possible accuracy of this placement technique depends on the size of the ragged edge pixels length compared to the probe size Ss of the beamlet. By careful selection, an accuracy of less than 1/10 of the grid cell dimensions is obtained. One solution for sub-pixel modulation is to use ragged edges. The sub-pixel placement of the feature edge is achieved by having some pixels on and some off within the outer pixel line of the feature. For example for an outer line with a series 2 on, 3 off, 2 on 3 off the edge in the resist, i.e. the target for writing the pattern on to, will be at 2/5 of a pixel. By choosing the correct ratio on/off the edge of the feature is effectively placed much finer than an applied pixel size Ps of e.g. 2.25 nm. Because the probe size Ss of the e-beam is much larger than the grid size, the raggedness of the line is virtually invisible in the final pattern. The maximum number of possible steps in the sub-pixel placement of the feature edge is according to insight underlying the invention limited, not only to probe size but also due to a blanker constraint, i.e. with a view to maintain economically achievable blanking systems of technically limited complexity. This constraint is however only set in the direction of the deflection scan. In FIG. 6B such impossible modulations are indicated by surrounding circles Np. This can be overcome by also leaving out pixels inside the feature, e.g. as in FIG. 6A.

Figure 5A:
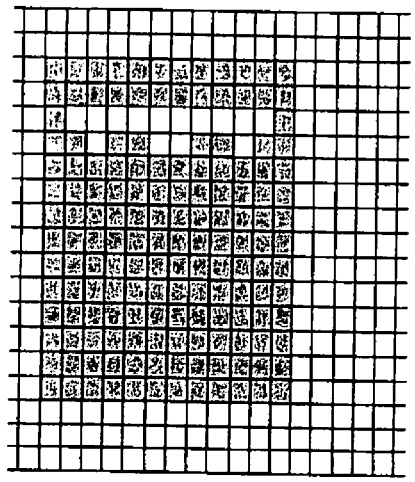
FIG. 5 illustrates a result of a lithography embodiment according to the present invention.
Figure 5B:
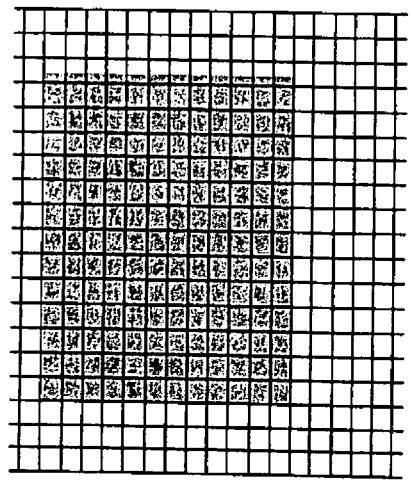

FIG. 5 illustrates a second measure and effect of a lithography system according to a further measure according to the present invention, based on leaving out, i.e. not writing pixels near a rastered edge. FIG. 5B in this respect shows the desired pattern to be written, while FIG. 5A shows the adapted rasterized pattern to achieve the exact placement of the feature. Instead of an adaptation of the edges of the pattern, in this embodiment the content of the grid cells within the feature are altered. The removal of a number of interior grid cells, i.e. in the deflection lines preceding the last deflection line, is for the purpose of positioning the edge of a feature performed adjacent the feature edge in the rasterized pattern, and effectively shifts the edge of the feature inwards as may be taken from the figure. Another method to shift the edge of a feature with sub-pixel resolution is to leave out, i.e. not to write complete lines near such edge, inside the feature. This measure is illustrated in FIG. 7.

Because the point spread function PSF of a written probe Ss is much larger than the address grid, the influence of deleting lines or part thereof inside a structure spreads out over the edges. The point spread function PSF is here defined as the inclination angle of the slope of the Gaussian curve that represents the impact of a writing beam on a litho target. At the edge of a feature, such deletion effectively lowers the dose and thus shifts the edge position. The distance over which the edge is shifted depends on how far from the edge the deleted pixel is located and on the number of deleted pixels. Leaving out an entire line in the mechanical movement Mm direction rather than in the scanning direction Sd however, would require that the blanker of the litho system can be switched on and off with 1 pixel frequency and thus would require a very fast rise/fall time of typically within tenths of nanoseconds, which will in practice not be realized due to associated costs and structural complexity of a blanker complying to such requirement. Yet, in principle also edges oriented in the direction of mechanical movement may be shifted e.g. by deleting, i.e. not writing pixels over a width of one or two cells as is illustrated by FIG. 7.

Figure 6A:
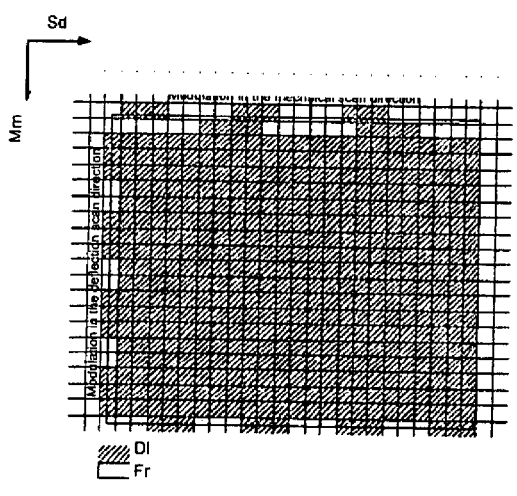
FIG. 6 illustrates a sub-pixel line-width modulation method according to the invention, utilising the "ragged edges" method.
Figure 6B:
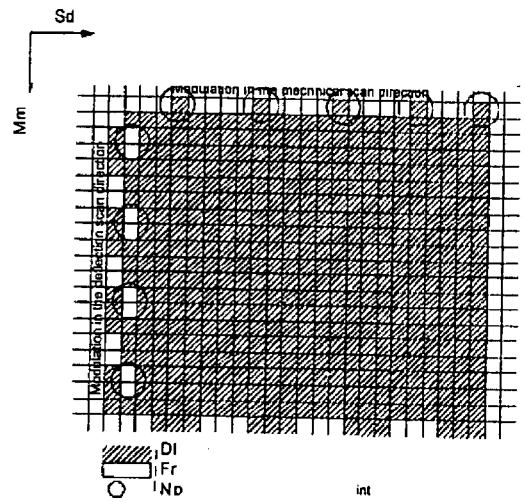

In practice according to the invention, a pattern to be exposed will not only be adjusted using each measure separately, but is favourably also used in a combination of the said two, e.g. as represented in FIG. 6A. In the blanking strategy as used in many lithography tools, the exposure of each grid cell is controlled by shielding the writing beamlet at the right moment in time using a blanker. When the operating frequency of a blanker is limited, which often is desired with a view to reducing costs and structural complexity of the blanker, the pattern is adjusted according to a suitable combination of said two measures in such a way that each individual blanker does not have to switch faster than said limiting frequency. In a further particular embodiment an entire deflection line interior to a ragged edge is blanked for the purpose of shifting the position said feature edge.

Figure 7:
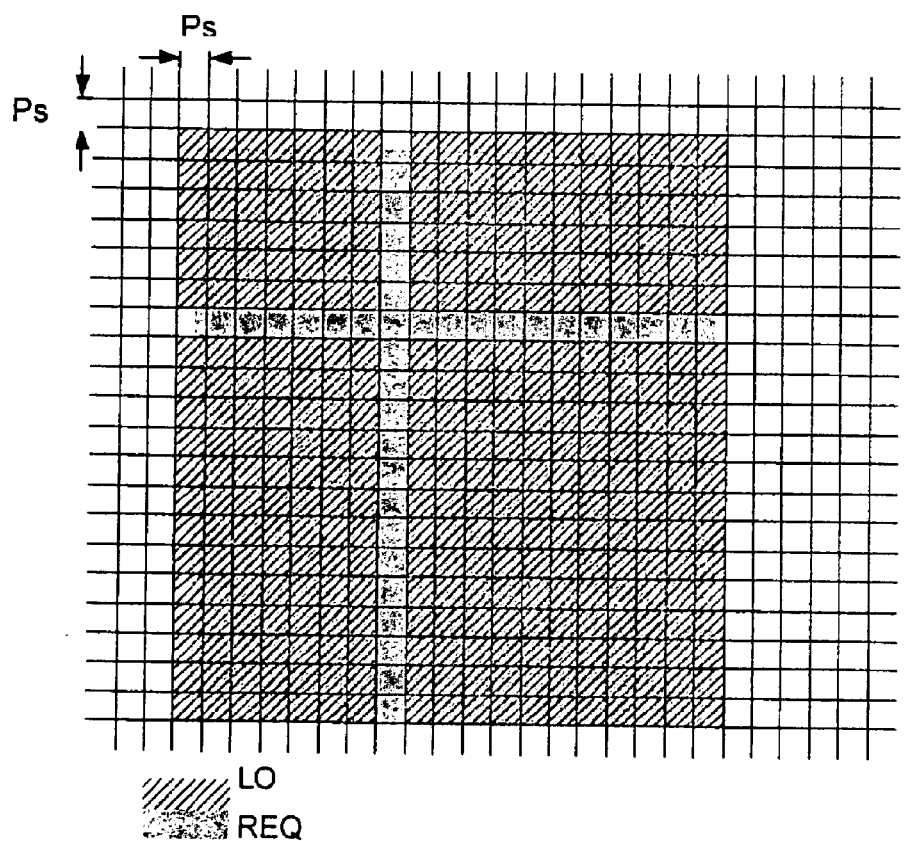
FIG. 7 illustrates the principle measure of not writing an entire line of cells within a feature for the purpose of shifting an edge.

In the examples illustrated by FIGS. 6 and 7, the writing strategy for writing a pattern on to a wafer is a raster scan with a pixels size of 2.25 nm. A constraint for electing grid size 2.25 nm grid is the imposition of a design grid. Two reasons that may affect the elected pixels size are that the size of 2.25 nm is not realistic for chip manufacturers because of a desired design freedom, and secondly, that at a proximity-effect for which a correction is needed with layout biasing, a need for sub-pixel placement arises, a solution to which need is supported by the present invention. An advantage of increasing grid size is the fact that less memory will be required in a so-called pattern streamer sub system (PSS) of a maskless lithography apparatus, which may significantly reduce costs of the apparatus. Also the pixel rate, i.e. the rate at which pixel information is fed to the system may remain relatively low. An advantage of the present invention therefore also resides in increasing grid size while maintaining design freedom by the use of the above explained ragged edge modulation. FIG. 6 illustrates that because of a for economic reasons present blanker constraint, the probe modulation as taken in the direction of mechanical movement Mm of a stage carrying the wafer or target to be processed, is slightly different from the type of modulation applied in the direction of the deflection scan Sd. Encircled positions Np indicate "off" modulations that, depending a specific lay-out of the system, in particular the available rate of blanker switching, could be impossible to perform. The hatched area Dl indicate the area as according to the lay-out data, while Fr denotes the area of the desired feature.

Figure 8:
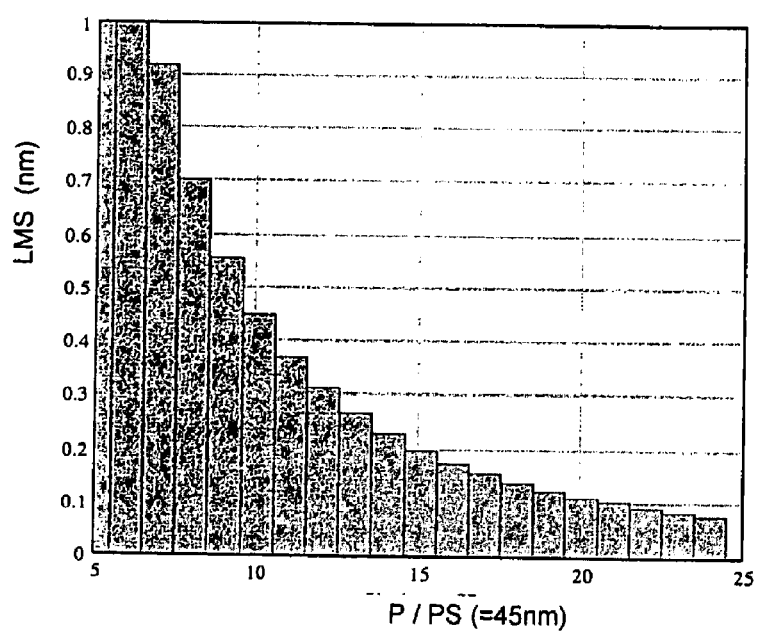
FIG. 8 illustrates the largest allowable modulation step size for single line "ragged edge", i.e. displacement of a feature edge by writing additional cells beyond a last array of cells to be written near the edge of a cell, for several grid sizes expressed in number of cells per critical dimension.

FIG. 7 by a hatched area LO illustrates a feature or image layout, while the grey area REQ reflects the required feature after exposure. It shows that with the measures according to the invention, the position of the edges of the written features shifts inwards at leaving out internal lines. Such shift is related to the distance of the left out line from the parallel edge to be shifted. It is understood through the present invention, that for proximity-effect correction (PEC) with layout biasing, i.e. adjusting the feature size based on local background dose level, a finer grid would be required which is not desired for economic reasons. With the ragged edges measure according to the invention, a grid of less than half a tenth of the grid size can be obtained with a maximum error in CD or line width roughness of a nominal value in the same order. In the light of this result, there is a basis to increase the grid size provided in the above example. The advantage is that such reduces the number of pixels and thus also the amount of uncompressed memory in a pattern streamer subsystem (PSS) of a litho machine. In FIG. 8, the results of calculations on on/off combinations for a single line ragged edge modulation is provided for several grid sizes, as expressed in number of pixels fitting a critical dimension (CD) applied in the system. It shows the largest modulation step-size as a result for a range of such grid sizes. It can be seen that from 15 pixels and up per CD, rather than 20 as in the above example, the error in location of parts of an edge positioned with the above described ragged edge method is below 0.1 nm, i.e. is virtually absent, at least fully acceptable, even in respect of the highly refined dimensions of projected features in contemporary lithography.

Apart from the concepts and all pertaining details as described in the preceding the invention also relates to all features as defined in the following set of claims as well as to all details as may be directly and unambiguously be derived by one skilled in the art from the above mentioned figures, related to the invention. In the following set of claims, rather than fixating the meaning of a preceding term, any reference numbers corresponding to structures in the figures are for reason of support at reading the claim, included solely as an exemplary meaning of said preceding term.

The invention claimed is:

1. Method of operating a writing beam probe forming lithography system for projecting a pattern on to a target surface, comprising:
    using an "on" and "off" writing strategy to operate said writing beam probe based on dividing said pattern over a grid comprising grid cells, wherein said pattern includes features having a size larger than that of each one of said grid cells,
    in each of said grid cells, switching said writing beam probe "on" or "off", wherein the writing beam probe on said target is set to cover a surface area that covers a plurality of grid cells, and
    wherein during a single pass of a writing beam
    effecting a position dependent distribution of "on" and "off" switching within a range of the writing beam probe size wherein said writing strategy is completed during said single pass.

2. Method according to claim 1, wherein said position dependent distribution is performed near an edge of a feature to be written on said target.

3. Method according to claim 1, wherein said position dependent distribution is performed for effecting a sub grid cell placement of a feature edge on said target.

4. Method according to claim 1, wherein positioning of a feature edge is effected by not writing part or parts of a line of grid cells oriented parallel to said edge, and located at a distance from said edge.

5. Method according to claim 1, wherein grid cells are written in at least one line of said grid adjacent a feature edge outside of said feature, whereby said line of grid cells is oriented in parallel to said edge.

6. Method according to the claim 5, wherein at least one set of a number of grid cells is additionally written in said line.

7. Method according to claim 1, wherein an overall dose modulation is effected for said feature, by switching on and off said writing beam probe in a regular pattern.

8. Method according to the claim 7, in which edges of said feature are shifted with respect to said grid.

9. Method according to claim 1, wherein on/off switching of a writing beam probe is slower than the pixel rate.

10. Method according to claim 1, in which an effective edge position of a feature of said pattern is controlled by not writing one or a set of grid cells within a range of the writing beam probe size from the edge.

11. Method according to claim 1, wherein the writing beam probe comprises a Gaussian probe, wherein a full exposure of a certain grid cell also causes a partial exposure in the grid cells adjacent to the exposed grid cell.

12. A writing beam probe forming lithography system for generating a pattern on to a target surface, comprising:
    using a writing strategy based on dividing said pattern over a grid comprising grid cells and wherein said writing beam probe is switched "on" or "off" in each one of said grid cells for writing or not writing each one of said grid cells, said pattern comprising features of a size larger than that of one of said grid cells,
    wherein the writing beam probe on said target is larger than the size of one of said grid cells in that said writing beam probe covers a plurality of grid cells, and
    wherein within a feature, a position dependent distribution of writing and not writing of grid cells is effected within a range of the writing beam probe size wherein said writing strategy is completed during a single pass of said writing beam probe.

13. System according to claim 12, in which the writing beam probe size is of a value within a range from 5 to 20 times the grid cell size.

14. System according to claim 12, wherein the writing beam probe comprises a Gaussian probe, wherein a full exposure of a certain grid cell also causes a partial exposure in the grid cells adjacent to the exposed grid cell.

15. Method for operating a lithography system in which a pattern is to be projected on to a target surface, comprising:
    using a plurality of writing beams in the form of probe forming beams, generated in a charged particle beams column part of said system, and scanned over said target surface for writing said pattern,
    modulating the writing beams in said column by blanking each writing beam individually within the column or not,
    writing said pattern being performed by scanning each individual writing beam in a direction transverse to a mechanical movement of said target relative to said column,
    positioning pattern features on said target using a virtual grid divided into grid cells of a dimension such that each probe forming beam covers a plurality of grid cells, and
    locating, an edge of a feature of a size larger than that of one of said grid cells virtually independent from said grid size by not writing at least one set of grid cells in at least the last scan line for writing said feature, which set is larger than a number of grid cells and smaller than the number of grid cells required for writing the dimension of each said probe forming beam,
    wherein said writing is completed during a single pass of said probe forming beams.

* * * * *